(12) United States Patent
Baumgartl et al.

(10) Patent No.: US 7,977,945 B2
(45) Date of Patent: Jul. 12, 2011

(54) MAGNETIC RESONANCE SYSTEM AND OPERATING METHOD THEREFOR

(75) Inventors: Rudi Baumgartl, Erlangen (DE); Nikolaus Demharter, Dormitz (DE); Georg Pirkl, Dormitz (DE); Roland Werner, Langensendelbach (DE)

(73) Assignee: Siemens Aktiengesellschaft, Munich (DE)

( * ) Notice: Subject to any disclaimer, the term of this patent is extended or adjusted under 35 U.S.C. 154(b) by 282 days.

(21) Appl. No.: 12/420,125

(22) Filed: Apr. 8, 2009

(65) Prior Publication Data

US 2009/0251141 A1 Oct. 8, 2009

(30) Foreign Application Priority Data

Apr. 8, 2008 (DE) .......................... 10 2008 017 819

(51) Int. Cl.
*G01V 3/00* (2006.01)
(52) U.S. Cl. ........................ 324/318; 324/309
(58) Field of Classification Search .......... 324/300–322; 600/407–445
See application file for complete search history.

(56) References Cited

U.S. PATENT DOCUMENTS

| | | | | |
|---|---|---|---|---|
| 4,594,550 A * | 6/1986 | Yamada et al. | ............... | 324/307 |
| 7,013,084 B2 * | 3/2006 | Battou et al. | ................. | 398/45 |
| 7,477,057 B2 * | 1/2009 | Baumgartl et al. | ........... | 324/322 |
| 7,727,153 B2 * | 6/2010 | Fritz et al. | ..................... | 600/449 |
| 2003/0214953 A1 * | 11/2003 | El-Demerdash et al. | ..... | 370/400 |
| 2007/0258479 A1 * | 11/2007 | Baumgartl et al. | ........... | 370/463 |
| 2008/0122443 A1 | 5/2008 | Fontius et al. | | |
| 2008/0136417 A1 * | 6/2008 | Baumgartl et al. | ........... | 324/322 |
| 2010/0317420 A1 * | 12/2010 | Hoffberg | ......................... | 463/1 |

* cited by examiner

*Primary Examiner* — Brij B Shrivastav
(74) *Attorney, Agent, or Firm* — Schiff Hardin LLP

(57) ABSTRACT

A magnetic resonance system has a number of components including a basic magnetic field generation unit, gradient coils as well as a radio-frequency coil arrangement. The components are respectively controllable according to a control sequence via at least one digital module and at least one analog module. The analog modules are arranged external to a control computer that controls the digital modules. The digital modules are likewise arranged external to the control computer and are associated with the analog module or modules controlled via the control computer. The digital modules are networked via the following networks for communication of the digital modules among one another and/or with the control computer: a synchronous first network to synchronize the digital modules, an isochronous or semi-isochronous second network, a third network, wherein the digital modules are connected with the control computer via serial peripheral component interfaces and a signal transmission between the peripheral component interface of the respective digital module and the associated peripheral component interface of the control computer thereby occurs on optical paths.

20 Claims, 3 Drawing Sheets

MAGNETIC RESONANCE SYSTEM AND OPERATING METHOD THEREFOR

BACKGROUND OF THE INVENTION

1. Field of the Invention

The present invention concerns a magnetic resonance system with a number of components including a basic magnetic field generation unit, gradient coils as well as a radio-frequency coil arrangement. The components are thereby respectively controllable according to a control sequence via at least one digital module and at least one analog module, and the analog modules are arranged external to a control computer controlling the digital modules. Moreover, the invention concerns a method for the operation of such a magnetic resonance system.

2. Description of the Prior Art

Magnetic resonance tomography is a widespread method to acquire images of the inside of a body. In this method the body to be examined is exposed to a relatively high basic magnetic field, for example of 1.5 Tesla, or even of 3 Tesla in newer systems, known as high magnetic field systems. A radio-frequency excitation signal (known as the $B_1$ field) is then emitted with a suitable antenna device, which causes the nuclear spins of specific atoms excited to resonance by this radio-frequency field are tilted by a specific flip angle relative to the magnetic field lines of the basic magnetic field. The radio-frequency signal radiated during the return of the nuclear spins to equilibrium (known as the magnetic resonance signal) is then detected with suitable antenna devices (which can also be the same as the transmission antenna device). The raw data acquired in this manner are used in order to reconstruct the desired image data. For spatial coding, defined magnetic field gradients are superimposed on the basic magnetic field during the transmission and the readout or acquisition of the radio-frequency signals.

Such magnetic resonance systems have a number of components that must be controlled under consideration of fixed time correlations within a predetermined measurement sequence in the framework of a measurement procedure. Among these components are, for example: the aforementioned basic magnetic field generation unit that serves to generate the basic magnetic field; the gradient coils that are used to generate the magnetic field gradients; and the radio-frequency coil arrangement, which normally has multiple radio-frequency coils for the transmission and/or acquisition of the radio-frequency signals. All of these components are typically operated in analog fashion, but the control ensues digitally. Therefore at least one digital module and at least one analog module are normally required in the control path to these components.

For the exemplary case of the radio-frequency coil arrangement, differentiation must be made between transmission modules and acquisition modules. Among other things, a radio-frequency amplifier is necessary in the transmission branch, this radio-frequency amplifier converting a radio-frequency signal previously generated in a digital transmission module into the analog radio-frequency signal to be emitted at the antenna. This signal must provide a sufficient radiating power. For signal acquisition, the received signal is initially demodulated with suitable electronics in an analog acquisition module and is converted by an A/D converter into a digital acquisition signal. This is sent to a digital acquisition module which digitally further demodulates and processes the digital signal. At present, known acquisition modules can processes a specific number of acquisition channels, meaning that they can demodulate and further process signals from a specific number of individual antennas. The signal of a frequency generation unit (usually an NCO—Numerical Controlled Oscillator), which supplies a suitable intermediate frequency, is necessary both at the transmission side (i.e. for the generation of the radio-frequency signal by the digital modulators) and at the acquisition side for digital demodulation.

Since it is essential for the measurement that the predetermined schedule of the emission of the individual signals (for example the radio-frequency signals, the gradient pulses and the readout commands) matched to one another must be precisely maintained, and for this each component must implement a very specific action at a precisely determined time, a central control concept has conventionally been used in which the various digital modules are integrated into the control computer. With the use of the system clock of the control computer and, if necessary, a clock or a timestamp, it is then possible to establish the synchronicity and isochronicity among the individual components. The digital modules are thereby typically fashioned as modules that can be connected to a bus within the control computer. With this centrally organized control system, a future maximum expansion must already be taken into account in the design since the capacities of the central control computer are limited both spatially and with regard to power. This means, for example, that whether additional transmission coils or reception coils are possibly to be added must be taken into account in the planning of the system. This maximum expansion, however, cannot be exactly planned for all system functionalities at the point in time of the design since the technical developments advance quickly. Therefore, it frequently occurs that current controls are presently either less-than-fully occupied or, in a disadvantageous case, that bottlenecks exist since existing expansion capabilities are not sufficient.

To solve this problem, a few niche solutions are known. For example, it has been proposed to realize a clone concept at the excitation side in which the control computer is present in multiple instances, and one of the control computers is wired as a master and the others as clients. This solution is technically very complicated and uneconomical and deals only with a partial aspect of one component, namely the transmission side. Such an individual solution is also known for the acquisition side, wherein ultimately a bus expansion offloaded from the control computer is proposed. However, a complete and economic solution of the problem does not exist with this either. Added to this, not only must exact time workflows be synchronized between the individual components among one another and the control computer, but also high data rates must be transferred (for example, the precise information about pulse sequences to be emitted at the transmission side, in particular, a number of precise envelopes for the radio-frequency pulses and/or gradient pulses), and a significant number of acquired measurement raw data at the acquisition side.

SUMMARY OF THE INVENTION

An object of the invention is to provide a magnetic resonance system as well as a method for the operation of a magnetic resonance system of the aforementioned type that allow a greater flexibility, in particular a cost-effective and fast expansion capability of the magnetic resonance system.

In the magnetic resonance system according to the invention, the digital modules are likewise arranged external to the control computer and associated with the analog module or modules controlled via the control computer, and the digital modules are networked via various networks for communication of the digital modules among one another and/or with the control computer.

A synchronous first network is used to synchronize the digital modules and the control computer. The necessary synchronization information (for example a system clock and, if necessary, timestamps) is transferred via this network. This synchronous first network is also designated in the following as a "synchronization network".

Furthermore, a connection of at least the digital modules among one another ensues via an isochronous or at least semi-isochronous second network. As used herein a semi-isochronous network means a network in which an isochronicity is not required for specific transferred commands or data and/or for specific components of the network. A network in which the data have reached their destination (here their destination digital module or, respectively, the control computer if this is also connected within the isochronous or semi-isochronous network) within a specific time window (for example a periodically occurring time window) is designated as an isochronous network, or an isochronous portion of a semi-isochronous network. For example, such a time clock can be 10 μsec or 10 msec. All existing digital modules must then receive their corresponding information from the network within such a time window. Thus, via the isochronous or semi-isochronous network, it is ensured that certain data can be exchanged within the various network nodes within a specific time period, such that these data are present with certainty at the appertaining modules when specific actions are to be executed according to this information. Since control commands and/or control information are transferred via this network, this isochronous or semi-isochronous network is also designated in the following as a "control command network".

Moreover, a networking of the digital modules with the control computer ensues via a third network. The transmission of the data between the digital modules and the control computer ensues within this third network with the use of serial peripheral component interfaces, wherein the signal transmission between the peripheral component interface of the respective digital module and the associated peripheral component interface of the control computer occurs on an optical path, i.e. via optical wave guide. A serial peripheral component interface means a standard high-speed interface that is suitable to connect peripheral components with a central processor.

The peripheral component interfaces are preferably of the type known as "PCI Express" interfaces (PCI=Peripheral Component Interconnect). This is an expansion standard for the connection of peripheral apparatuses with the chipset of a central processor within a computer. Standardized interfaces of this type have been on the market for some time. The data transfer in the PCI Express standard typically ensues via "lanes", wherein in "normal" PCI Express each lane is composed of one electrical conductor pair for transmission and a second pair for reception. By contrast, according to the invention, optical wave guides are used instead of electrical conductors, i.e. to modify the normal PCI express interfaces to the effect that the outgoing signals are initially transduced into optical signals and, in reverse, the received optical signals are transduced into corresponding electrical signals. Moreover, the entire data exchange is implemented according to the predetermined protocol of the PCI Express interface. The use of optical wave guides for the mass data network has the advantage that a galvanic separation can ensue between the individual digital modules and the control computer. In principle, it is possible and (depending on the concrete design of the magnetic resonance system) possibly even preferable to also technically realize the synchronization network and/or the control command network with the aid of optical wave guides.

Instead of such a PCI Express interface, other serial peripheral component interfaces can be used that operate in a similar manner, for example possible successor standards for PCI Express. Primarily mass data, i.e. complex data structures with significant bandwidth requirements that for the most part exist in the form of data arrays (for example envelopes for radio-frequency pulses to be generated or raw data acquired at the acquisition side), are exchanged via this third network. This third network is therefore also designated as a "mass data network" in the following, but without precluding for example, that control data are also transmitted via this mass data network.

An ideal compliance with all time conditions is possible by means of the synchronization network and the isochronous additional network. All critical control commands can be sent to the digital modules approximately simultaneously via the isochronous network. Additionally, larger data sets can also be quickly and securely exchanged in time-critical situations via the special mass data network. The final synchronization can then be ensured via the synchronization network. In particular, in such a system it is also possible that the various frequency generation units in the individual digital modules (for example the NCOs) are controlled so that the frequency and phase conditions of the radio-frequency signals (thus the necessary coherency conditions) are safely maintained.

According to the invention, it is possible to relocate all magnetic resonance-relevant functions from the control computer to external components. In the extreme case the control computer can be reduced to a communication node that, for example, decides a predetermined control sequence and distributes it to the various components or their associated digital modules.

A nearly unlimited and simultaneously very simple (and thus cost-effective) expansion capability of the entire system is thereby offered. The size of such a magnetic resonance system is limited only by the bandwidth of the peripheral component interface that is used. However, the entire network can advantageously also be designed to be scalable so that even this limitation is lifted.

In a method according to the invention for the operation of a magnetic resonance system which has a number of components (including a basic magnetic field generation unit, gradient coils as well as a radio-frequency coil arrangement), the components are respectively controlled according to a control sequence by a control computer via at least one digital module and at least one analog module, with the analog modules being arranged external to the control computer that controls the digital modules. According to the invention, the digital modules are arranged external to the control computer and associated with the analog module or modules controlled via said control computer. The control of the digital modules then ensues via the different networks described above, wherein a synchronization of the digital modules ensues by means of a time-synchronous first network. A control command distribution to the digital modules ensues using an isochronous or semi-isochronous second network; and a mass data transmission between the digital modules and the control computer ensues via a third network. This third network is designed as described with the use of serial peripheral component interfaces; and the signal transmission between the peripheral component interfaces ensues via optical paths.

As already explained, the peripheral component interfaces preferably have PCI Express interfaces or, respectively, consist in the simplest case of PCI Express interfaces equipped for the optical data transfer. This has the advantage that already-standardized components are available which must merely be provided with corresponding electro-optical transducers in order to build the desired third network. Via PCI Express or a similar standard, by means of the technique known as DMA (Direct Memory Access) the various digital modules can also respectively directly access a memory range of the control computer that is associated with them for data exchange with said control computer. An access model that is identical for all components thus arises for the system software (i.e. (for example) the operating system and the drivers at the individual digital modules), which is defined by PCI Express (or the comparable standard). All components are thereby directly addressable via the PCI Express address space, which means not only the internal components of the control computer but rather also the external digital modules connected via the third network. The latency in the data transfer from the memory of the central control computer to the decentralized components is thus also minimized since the conversion to another protocol is done away with. Furthermore, all system management functions defined by the PCI Express standard are automatically available, such as numeration, Plug-and-Play functions, power management, etc.

All networks can in principle be designed with different topologies.

However, in order to prevent different delays in the synchronous network, this is advantageously fashioned as a star topology. For example, such a star topology can be realized via one or more splitters via which the signal can simultaneously be provided to various conductors (lines). A cascaded star topology can be configured as a cascade circuit of such splitters.

In contrast to this, the isochronous or semi-isochronous second network is advantageously designed in the form of a ring topology. A preferred variant of this embodiment is explained in detail later. A ring topology has the advantage that the connection effort is significantly less than in another topology.

In contrast to this, the third network (the mass data network) is advantageously likewise designed in the form of a star topology. Every single digital module is thereby connected with the control computer with a peer-to-peer connection via PCI Express interfaces (or, respectively, a similar peripheral component interface) and via optical wave guides. If necessary, this network can also be designed in the form of a cascaded star topology.

The control command network is advantageously designed so that it connects only the individual digital modules among one another but not the digital modules with the control computer itself. A distribution of the control information or, respectively, control commands to be passed from the control computer to the digital modules can ensue such that these are initially sent only to one of the digital modules which is fashioned as a master digital module—for example correspondingly configured with suitable software. The respective control commands are then transmitted via the second network to the other digital modules.

This master digital module particularly preferably receives the corresponding control commands from the control computer via the third network, the mass data network. For example, if the third network has been build with the aid of PCI Express interfaces, this standard leads to the situation that the digital modules are recognized by the control computer like internal computer components anyway, such that a very fast communication to the appertaining master digital module can occur. The use of a master digital module instead of a connection of the control command network with the control computer itself has the advantage that an additional interface within the control computer for the control command network can be foregone.

With this concept, it is also possible in principle that the same digital module is not always used as a master digital module for the redistribution of the control commands via the control command network; rather, this functionality changes, possibly dependent on the time or dependent on specific control commands. In principle, multiple digital modules can also be simultaneously fashioned as master digital modules.

As explained above, the second network is the control command network, advantageously designed in the form of a ring topology (i.e. all digital modules are connected among one another in a ring). In this network data packets can then be continuously passed along within the network ring, wherein the passage time of a data packet through the entire ring can form the time clock of the control command network. With this ring topology it is then ensured that a specific control command which (for example) is sent into the ring from the master digital module has assuredly reached all other digital modules within the predetermined time clock.

It is thereby possible to send respective individual control commands to the individual digital modules or specific groups of digital modules in that, for example, a data packet contains different data segments that are positioned and/or encoded in a precisely defined manner in the data packet so that the digital module can respective recognize which control command is intended for it. It is also likewise possible to send the same control command to all digital modules in a broadcast method, which same control command is then used by all digital modules. Furthermore, the individual digital modules can also send the same control information via the control command network in that they store their data in a precisely defined manner, for example in a specific segment of a data packet and/or with a precisely defined unique encoding, that can then be read out by the other digital modules to be addressed and/or a control computer.

The first network advantageously has a synchronization module arranged in the control computer, which synchronization module controls synchronization units arranged in the digital modules via the first network. The synchronization module of the control computer can then provide the signals that are distributed via the synchronization network to the corresponding synchronization units of the digital modules. A system clock generated by the synchronization module can thereby particularly preferably be transferred via the synchronization network. Such a system clock can be 10 MHz, for example. Such a system clock is also used in the central arrangements already in use in the prior art. If the control computer and the digital modules are synchronized to the same system clock, the electronics that have previously been used can thus be reused as if they were still arranged within the system computer.

The time clock of the control command network preferably is an integer multiple of the system clock. Conditional control signals thus can be more easily suppressed via the control command network. Additionally, no data slip can arise within the control command network between the sending unit and the receiving unit. In particular, it is also possible that the clock rate of the control command network precisely corresponds to the system clock. For example, control commands that are applicable during the following system clock can be delivered to the varying digital modules within the current system clock. Additional time references in addition to the system clock could no longer be necessary in this case since the system clock itself serves as a timestamp.

The most varied method variants are possible in order to achieve a time reference via which it is ensured that the control commands are also executed at the correct point in time.

Two different basic methods can be differentiated.

In a first preferred method, a timestamp for marking a reference point in time is transferred to the system clock. The transfer of such a timestamp can ensue at regular periodic intervals. The precise manner of the transfer can be realized in different ways. On the one hand the timestamps can be modulated to the system clock, for example. In this case a corresponding filter is necessary in the receiver module in order to demodulate the timestamps again from the system clock. It is also likewise possible to signal the timestamps via an amplitude increase of the system clock. This has the advantage that the phase of the system clock remains unaffected. In order to entirely avoid such interfering influences, the synchronization network could also possess multiple parallel conductors, wherein one serves for the transmission of the system clock and the second serves for the transmission of the timestamps. According to an additional alternative, the timestamps are also sent via the mass data network insofar as is it ensured that the timestamps simultaneously reach the individual digital modules. If the control command network is likewise designed as a star topology, a simultaneous sending of the timestamps would also be possible via the control command network.

In a fundamentally different method, the digital modules, or their synchronization units as well as the synchronization module of the control computer, can each have a timing circuit, and all timing circuits can be synchronized and set to the same time. A global time is thereby established in the entire system, so to speak, and the validity points in time contained in the control commands can be defined using this time. The synchronization of the timing circuits can thereby advantageously ensue via the synchronization network, and the setting of the timing circuits to the same time ensues via the second and/or third network. For example, a reset signal for the synchronous restarting of all timing circuits can be transferred via one of the networks. The transmission of the necessary signals can thereby ensue in the same manner as given the transmission of the timestamps described above, i.e. via an amplitude increase of the system clock, via additional signal lines or via use of the mass data network, for example.

In an additional variant, the control computer is fashioned to adjust the timing circuit via an adjustment algorithm utilizing the network. Such adjustment algorithms are convergent algorithms that lead to the situation that all timing circuits in the system adopt an identical value. According to one example algorithm, upon starting up the magnetic resonance system or, respectively, the associated networks a learning phase is initially started in which the control computer or the timing circuit initially sends a current timing circuit state to the digital modules. The digital modules set their timing circuits to the arriving time and send their current time back to the control cop. This compares the arriving time with its own and determines the difference, after which half of the difference is added to the current time of the control computer and the obtained value is again sent to the digital modules. These in turn set their timing circuits to the arriving time and send the update time back to the control computer. This thereupon adds the difference determined above and compares this with its current time. Insofar as a difference still exists, half of the difference is again added to the time and the value is sent to the digital modules. After a few iterations, all timing circuits are thus synchronized and should indicate the identical value.

In addition to the components described above (the basic magnetic field generation unit, the gradient coils and the radio-frequency coil arrangement), other components of the magnetic resonance system (in particular a shim system and/or a monitoring system and/or a coil interface and/or the patient table controller of the magnetic resonance system) can be controlled in the same manner. Additional accessory components that are controlled or read out in the framework of the operation of the magnetic resonance system (for example external measurement apparatuses such as EKGs etc.) can be integrated without problems into the control system according to the invention in that corresponding digital modules that are connected as well within the networks are associated with these systems.

At least one digital module is preferably installed together with at least one analog module that it controls in an external piece of equipment. This in particular applies at the transmitter side for a power amplifier that can be integrated into an apparatus together with the associated digital transmission module, and on the receiver side for a signal preamplifier (necessary for the magnetic resonance signal acquisition) that can be integrated into an apparatus together with the associated digital acquisition module. A combination in an apparatus leads to cost savings since the analog modules are for the most part housed anyway in sufficiently large housings, and only a card with the associated digital module would have to still be installed.

DESCRIPTION OF THE PREFERRED EMBODIMENTS

Figure 1:
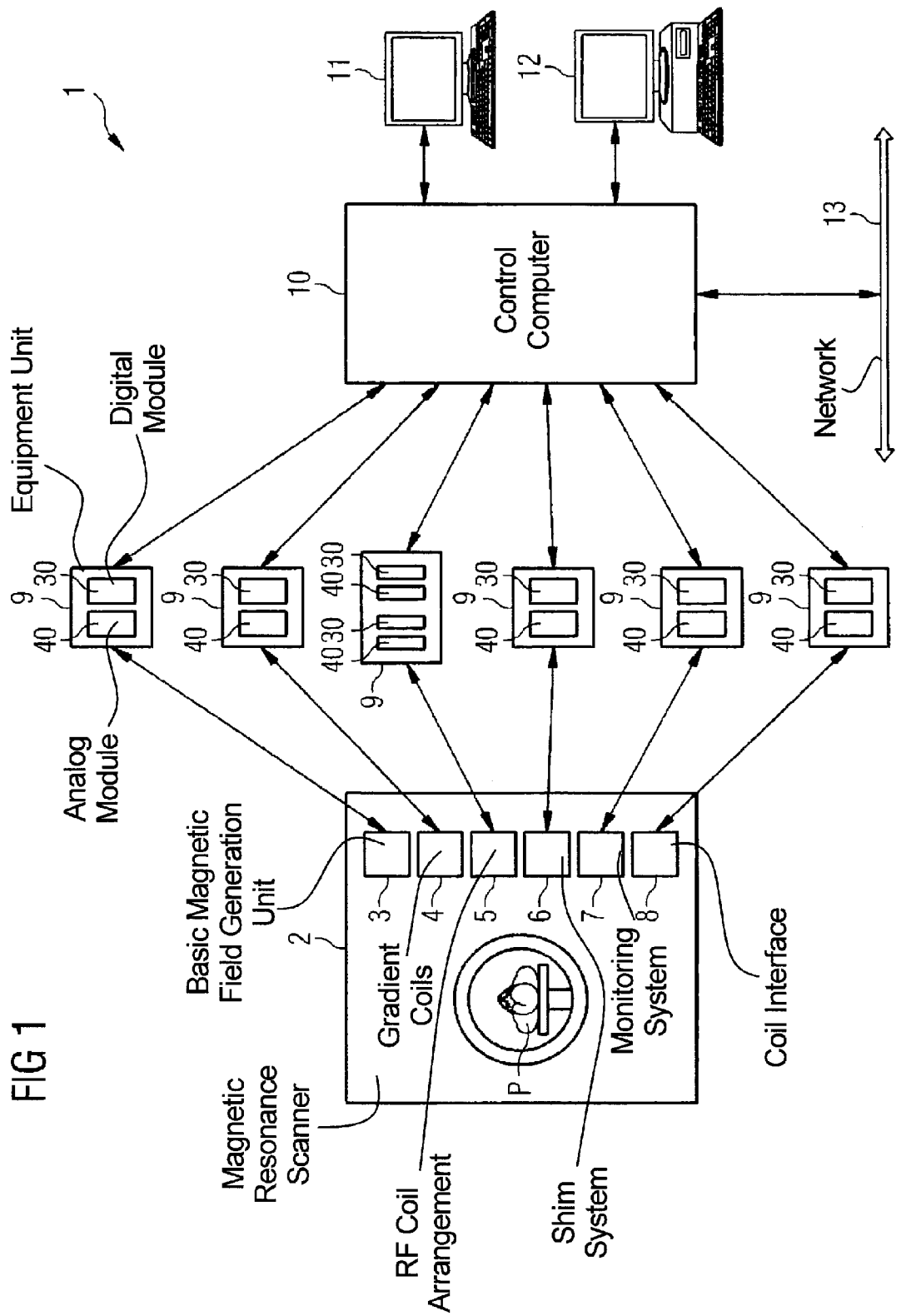
FIG. 1 is a schematic representation of an exemplary embodiment of a magnetic resonance system according to the invention.

A magnetic resonance system 1 according to the invention is presented in a general schematic in FIG. 1.

The system includes the actual magnetic resonance scanner 2 in which a patient P or test subject is supported on a patient bed in an examination space or patient tunnel during an examination. In this magnetic resonance scanner 2 there are a number of components 3, 4, 5, 6, 7, 8 that are only schematically shown. These components 3, 4, 5, 6, 7, 8 include a basic magnetic field generation unit 3 which ensures that an optimally homogeneous basic magnetic field is present within the patient tunnel. Furthermore, the magnetic resonance scanner 2 contains gradient coils 4 with which a magnetic field gradient can be applied in a defined manner within the patient tunnel, as well as a radio-frequency (RF) coil arrangement 5 (for example a whole-body antenna) via which radio-frequency fields can be emitted in the patient tunnel. Also among the components are: a shim system 6 to improve the homogeneity of the basic magnetic field; a monitoring system 7 for general monitoring tasks; and a coil interface 8 at which additional coils (such as local coils, head coils or the like) that can be placed on the patient can be connected in order to then acquire magnetic resonance signals with these coils.

Such a magnetic resonance scanner has or can have a number of additional components that can be controlled in the same manner with the control system.

In the exemplary embodiment shown in FIG. 1, there is an equipment unit 9 associated with each of these components.

In addition to this, configurations are also possible in which multiple components are associated with a common equipment unit, or multiple equipment units are associated with one component. The equipment units 9 here contain various units, for example control units, supply units, measurement units and the like. In particular, at least one digital module 30 and one analog module 40 associated with this digital module 30 are contained in each equipment unit 9, which digital module 30 and analog module 40 control the associated component 3, 4, 5, 6, 7, 8 in a magnetic resonance scanner 2 according to a predetermined control sequence. In the exemplary embodiment, it is shown as an example only in one equipment units 9 that this can contain multiple digital modules 30 and analog modules 40.

The equipment units 9 can also fulfill very specific additional functions. For example, the analog modules 40 in the equipment units 9 can be fashioned as suitable power amplifiers for the radio-frequency coil arrangement 5 and/or the gradient coils 4. For example, the analog modules 40 in the equipment unit 9 for the coil interface 8 also can be fashioned as preamplifiers in order to accept magnetic resonance signals. The use of multiple digital modules 30 and analog modules 40 within an equipment unit 9 is particularly useful for the radio-frequency coil arrangement 5 (as shown in FIG. 1) since this can be used both for the transmission of radio-frequency pulses and for the acquisition of MR signals. In this case, the equipment unit 9 could, for example, contain one digital module 30 and an associated analog module 40 for the transmission branch and one digital module 30 and an analog module 40 for the acquisition branch.

Furthermore, the magnetic resonance system according to FIG. 1 has a control computer 10 that, for example, contains the control sequence to be implemented by an operating unit 11 or an external computer 12. This control computer 10 can also be connected with a network 13 via which the one sequence to be implemented is transmitted to the control computer 10. Acquired image data can likewise be shown at the operating unit 11 or the external computer 12. Furthermore, such image data can also be sent via the network 13 to other computers (for example finding stations) and/or to mass storage for archiving.

The design of possible control sequences as well as the basic mode of operation of magnetic resonance systems 1 are known to those skilled in the art and therefore need not be explained further herein. The core of the invention is the communication between the control computer 10 and the individual equipment units 9, wherein it is essential that the digital modules 30 are arranged external to the control computer 10 and are associated with the analog modules 40 controlled by the digital modules 30. It is advantageous but not necessary that said digital modules 30 together with the associated analog modules are integrated into a common equipment unit 9, as in the exemplary embodiment according to FIG. 1.

Figure 2:
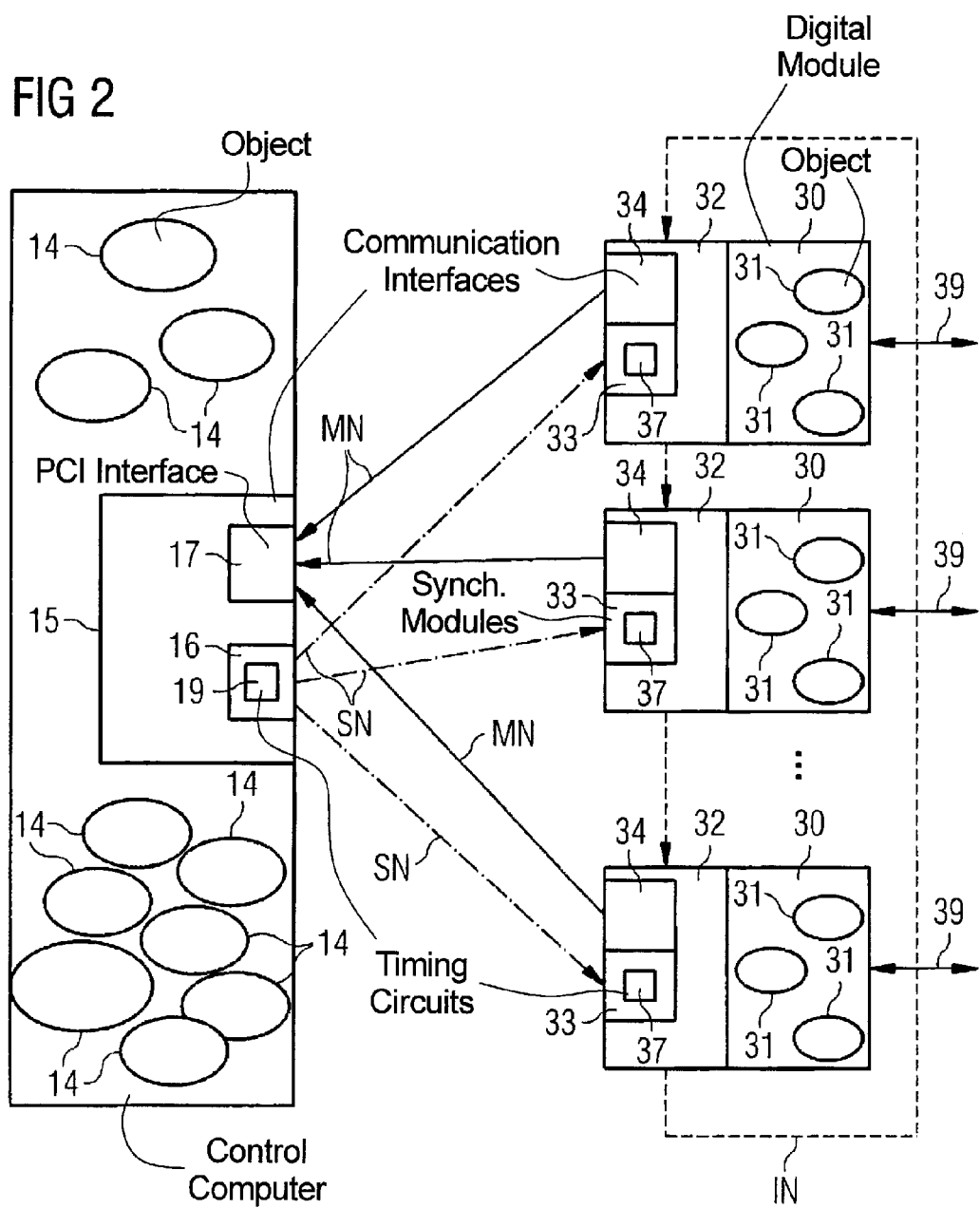
FIG. 2 is a more detailed schematic representation of the control system of the magnetic resonance system according to FIG. 1, with first, second and third networks.

FIG. 2 shows a preferred exemplary embodiment for a possible communication architecture between the control computer 10 and the individual digital modules 30, $30_M$.

According to this, the digital modules 30, $30_M$ are connected among one another or with the control computer 10 via three different networks SN, IN and MN. A first network is the synchronization network SN which connects the control computer 10 with the individual digital modules 30, $30_M$ in a star shape. The individual digital modules 30, $30_M$ are then connected among one another via a second, ring-shaped, isochronous network IN, the control command network IN. All digital modules 30, $30_M$ are additionally connected with the control computer 10 via a star-shaped third network, the mass data network MN. The precise design and the precise mode of operation of these networks SN, IN and MN are explained in the following.

Within the control computer 10, specific functionalities are fulfilled in order to control the individual digital modules 30, $30_M$ in the correct manner and at the correct point in time. For this the individual digital modules 30, $30_M$ must be supplied with the most varied parameter values or more comprehensively complex data or, respectively, corresponding parameters or data must be retrieved from the individual digital modules 30, $30_M$ at a suitable point in time. All of these parameter values and data (for example monitoring signals, raw data, envelopes for radio-frequency pulses or gradient pulses, switching times for readout of radio-frequency signals, status data, patient safety signals etc.) are designated as "objects" 14 in the following. These objects 14 must be sent from the control computer 10 to the digital modules 30, $30_M$ in a timely manner via the networks so that corresponding objects 31 there are stored at the matching digital modules 30, $30_M$ in which they are needed and so that the functionalities connected with them can be executed at the correct point in time. The digital modules 30, $30_M$ then control the associated analog modules 40 (see FIG. 1) via suitable interfaces 39 (which are represented here as simple arrows).

For communication with the digital modules 30, $30_M$ the control computer 10 possesses a communication interface 15 that, among other things, includes a synchronization module 16 with a timing circuit 19. This synchronization module 16 is connected via the synchronization network SN with synchronization units 33 in the digital modules 30, $30_N$. A suitable system clock is provided by the synchronization module via the synchronization network SN. This system clock is 10 MHz, for example. Due to the star topology of the synchronization network SN, this system clock arrives at the same points in time at the synchronization units 33 of the digital modules 30, $30_M$. The synchronization units 33 here are shown in the digital modules 30, $30_M$. It is also possible (for example in the event that multiple digital modules are present in an equipment unit 9) for the respective equipment unit 9 to have only a single common synchronization unit 33. The star topology of the synchronization network SN here is enabled by a splitter (not shown). Multiple splitters can also be cascaded in order to construct larger networks.

Moreover, a special PCI interface 17 in order to connect the individual digital modules 30 with the control computer 10 via a mass data network MS belongs to the communication interface 15 of the control computer 10. Complex data structures with significant bandwidth requirements that for the most part exist as data arrays are sent by the control computer 10 to the digital modules 30, $30_M$ and vice versa via this mass data network MN. For example, complex envelopes can be sent via this mass data network MN in the transmission branch (path) to the corresponding digital modules which control the power amplifiers for the emission of radio-frequency pulses or gradient pulses, or the acquired raw data can be accepted via this interface 17 from a digital module which is responsible for the readout of acquired magnetic resonance signals.

Figure 3:
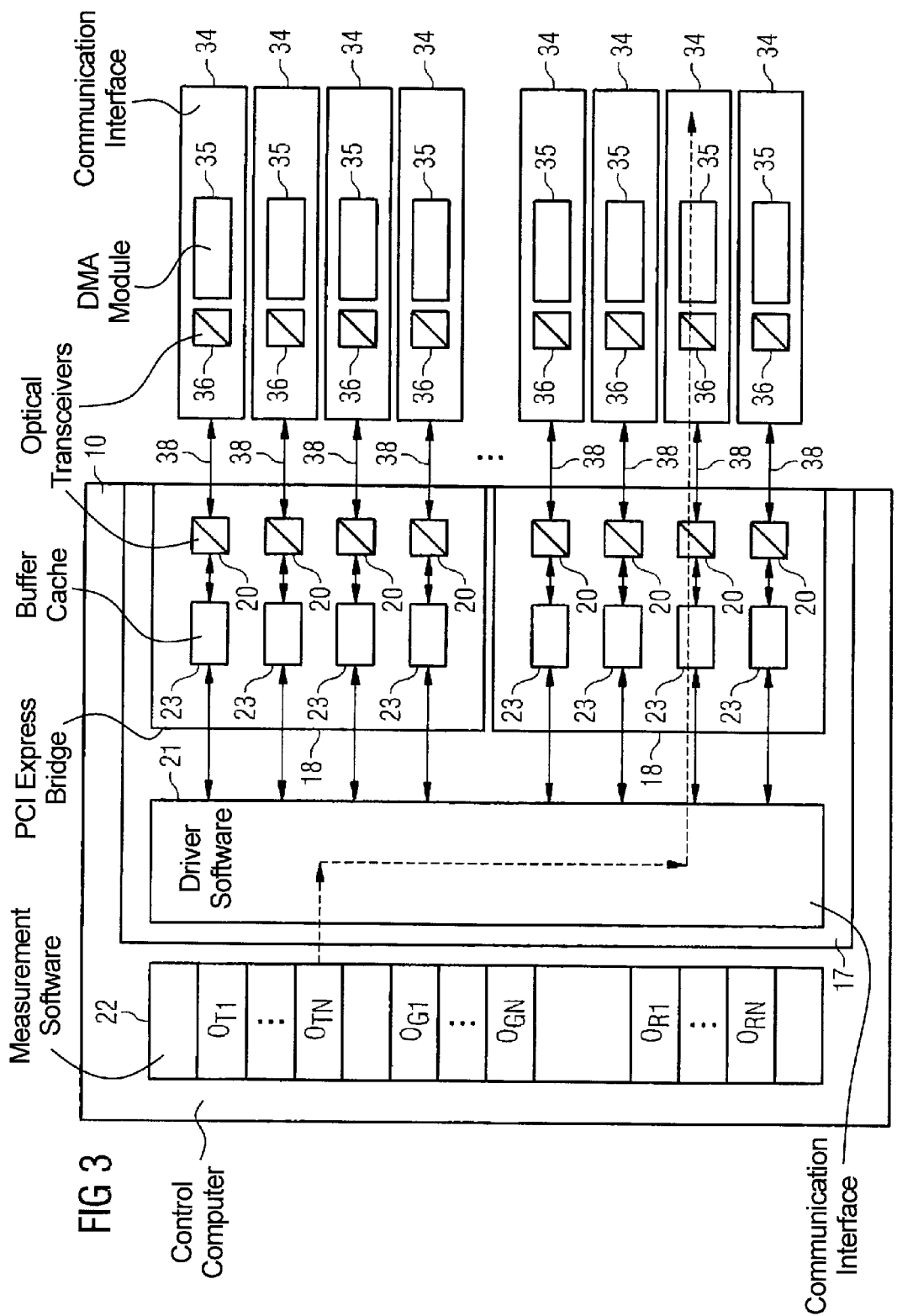
FIG. 3 is a schematic, more detailed representation of the third network of the magnetic resonance system according to FIGS. 1 and 2.

The more precise design and the mode of operation of this network MN are presented in somewhat more detail in FIG. 3. The corresponding interfaces 34 in the individual digital modules are respectively shown here on the right side. The interface 17 responsible for this network in the control computer 10 comprises multiple of what are known as PCI Express bridges 18, which has four outputs. This means that four corresponding PCI Express interfaces 34 (and thus four different digital modules) are connected to each PCI Express bridge 18.

The PCI Express interfaces 34 at the digital modules here respectively has local DMA modules 35. With the use of these DMA modules 35 the interfaces 34 (and thus the respective digital modules 30, $30_M$) are in the position to directly access a memory range provided for this within the control computer 10 via the PCI Express connection and to store or to transfer data. Buffer caches 23 that serve to bridge the main memory delays are located in the PCI Express bridges 18 for each channel in a typical manner.

Deviating from the typical PCI Express connections, here both the PCI Express bridges 18 and the PCI Express interfaces 34 has optical transceivers 20, 36 in the individual digital modules, which optical transceivers 20, 36 are respectively connected with one another via optical wave guides 38 in order to transducer electrical signals to be emitted into optical signals or, respectively, in order to transduce signals arriving via the optical wave guides 38 back into electrical signals. Here an optical PCI Express network is built in this manner.

As already explained, a specific control sequence to control the magnetic resonance system is generated by a measurement software 22 which is realized on a corresponding processor of the control computer 10. This control sequence contains a number of objects $O_{T1}, \ldots, O_{TN}, O_{G1}, \ldots, O_{GN}, O_{R1}, \ldots, O_{RN}$. Of these objects, a few contain the essential information for emission of radio-frequency pulses, for example the objects $O_{T1}, \ldots, O_{TN}$. For example, these can be the envelopes. Additional objects $O_{G1}, \ldots, O_{GN}$ are objects for the control of the gradient coils, and still other objects $O_{R1}, \ldots, O_{RN}$ serve to control readout units (i.e. these objects must be sent to the digital modules which control the analog receiver units for preamplifier and first processing of the acquired magnetic resonance signals). All of these objects $O_{T1}, \ldots, O_{TN}, O_{G1}, \ldots, O_{GN}, O_{R1}, \ldots, O_{RN}$ must respectively be sent in a timely manner to the correct digital modules that require the appertaining objects $O_{T1}, \ldots, O_{TN}, O_{G1}, \ldots, O_{GN}, O_{R1}, \ldots, O_{RN}$.

For this the interface 17 additionally possesses a driver software 21 which is likewise realized on a suitable processor in the control computer and which associates the objects with the respective targets. For example, this can ensue in that the various objects are stored in specific memory ranges in a memory of the control computer 10 that are associated with the respective targets (i.e. the matching digital modules). A signal is sent via the matching PCI Express bridge 18 to the local DMA 35 of the respective PCI express interface 34 of the corresponding digital module, which is thereby prompted to read out the data from the memory. Via the connection over the PCI Express interfaces with DMA functionality, the individual digital modules can be controlled just like components internally present in the control computer.

Shown as an example in FIG. 3 is a case in which an object $O_{TN}$ required for emitting the radio-frequency pulses is sent to an interface 34 which here belongs to a digital module that controls the radio-frequency transmission coils or, respectively, their analog module.

As shown in FIG. 2, the various digital modules 30, $30_N$ are also additionally connected among one another over an isochronous network IN via corresponding interfaces 32 in the digital modules 30, $30_M$. This isochronous network IN is a ring network in which data packets circulate annularly in a specific time clock which is an integer multiple of the system clock. Control commands or, respectively, control information can be exchanged among the individual digital modules 30, $30_M$ via this isochronous ring network IN.

One of the digital modules $30_M$ is hereby a master digital module $30_M$. If a specific control command should be distributed from the control computer 10 to all digital modules 30, $30_M$, this control command is initially transmitted via the PCI Express interface which connects the master digital module $30_M$ with the control computer 10. The master digital module $30_M$ then relays this control command in unmodified form (or possibly in a form converted to a different protocol) via the isochronous network IN to the other digital modules 30. The individual digital modules can also notify one another and exchange necessary information via this isochronous network IN without action of the control computer 10.

Previous control commands with regard to the NCOs, their parameterization and the point in time at which this parameterization should be started can thus be passed in a timely manner via the isochronous ring network IN to the respectively transmission and reception systems that contain an NCO. It is thereby minded that the control commands are sent via the isochronous network IN so that they reach the corresponding digital module in every case before the point in time of their execution or, respectively, their validity. This is ensured via the isochronicity of the data network IN in which, in principle, the entire data exchange is concluded within a periodic, recurring time interval in one ring passage.

Typical control information that must be exchanged isochronously (i.e. within a specific transmission time span) with certainty among specific digital modules are, for example, information for the updating of the RF frequency given the variation of the gradient field. Namely, the basic magnetic field is disadvantageously somewhat adulterated by the coils of the gradient system. The resonance frequency is thereby slightly shifted. An updating of the radio-frequency value is therefore required in order to avoid image artifacts. Such an updating must always ensue with certainty within a clock pulse of approximately 10 μsec. In the presented magnetic resonance system this can advantageously ensue via the isochronous network IN entirely among the individual digital modules without the control computer 10 being loaded by this.

So that the individual control commands exchanged via the isochronous ring network IN or the data (for example the envelopes) transmitted via the mass data network MN are also executed at the right point in time, a timestamp T can respectively be transferred with the data. This represents a reference point in time using which it can be determined when the respective data or, respectively, control commands are valid. In the shown exemplary embodiment the timestamp can additionally be transferred via the synchronization network SN, wherein it can additionally either be modulated to the system clock or can be coded via an amplitude variation of the system clock.

In the exemplary embodiment shown in FIG. 2, the synchronization module 16 in the control computer 10 and the synchronization units 33 in the digital modules 30, $30_M$ respectively comprise a timing circuit 19, 37. The entire system 1 is thus fashioned so that the timing circuits 19, 37 are synchronized with one another and indicate the same time. For this, for example, a reset signal and a time signal can be transferred via the synchronization network SN, which reset signal and time signal are modulated again to the time clock, for example. Alternatively, corresponding data can also be transferred via the PCI Express interfaces. If all digital modules 30, 30$_M$ and the control computer 10 possess synchronous and simultaneously running timing circuits, the times at which specific control commands or other control data (such as envelopes or the like) are valid can also be defined using a time specification that can be established with the aid of the timing circuits.

As the exemplary embodiment described above shows, the control computer 10 is unburdened with the aid of the various networks SN, IN, MN since it ultimately forms only another communication node that decodes a provided control sequence and distributes it to the various units. Via the high-capacity mass data network which is in particular provided via the special optical PCI Express interfaces, it can be ensured that the information relevant to the excitation is distributed (for example by means of DMA access) in a timely manner to the different nodes or the acquisition information is delivered back in a timely manner without a central processor of the control computer having to intervene at all. The control architecture according to the invention thus leads not only to the situation that an easier scaling capability of the entire system is achieved but that, in principle, a control computer 10 can also be used that must be significantly less powerful than the previously used control computer. In the simplest case, a simple PC could be used for this. The entire "intelligence" of the magnetic resonance system 1 is distributed (in particular via the third network) among a number of components (namely the control computer and the various connectable digital modules) that are networked among one another and interact quickly with one another.

Although modifications and changes may be suggested by those skilled in the art, it is the intention of the inventors to embody within the patent warranted hereon all changes and modifications as reasonably and properly come within the scope of their contribution to the art.

We claim as our invention:

1. A magnetic resonance system comprising:
   a plurality of components including at least a basic magnetic field generation unit, a gradient coil system, and a radio-frequency coil arrangement;
   a control computer;
   a plurality of digital modules and at least one analog module physically and electrically associated with one of said digital modules, said plurality of digital modules and said at least one analog module being external to said control computer;
   said control computer, said plurality of digital modules and said at least one analog module being configured to operate said plurality of components to acquire magnetic resonance data from an examination subject;
   each of said digital modules having a digital module peripheral component interface, and said control computer, for each of said digital module peripheral component interfaces, having an associated control computer peripheral component interface;
   a synchronous first network placing said digital modules in communication with said control computer to synchronize said digital modules;
   a second network selected from the group consisting of isosynchronous networks and semi-isosynchronous networks, that places said digital modules in communication with each other; and
   a third network consisting of optical paths that place the respective digital module peripheral component interfaces in communication with the associated control computer peripheral component interfaces.

2. A magnetic resonance system as claimed in claim 1 wherein each of said digital module peripheral component interfaces and said control computer peripheral component interfaces is a PCI Express interface.

3. A magnetic resonance system as claimed in claim 1 wherein said synchronous first network has a star topology.

4. A magnetic resonance system as claimed in claim 1 wherein said second network has a ring topology.

5. A magnetic resonance system as claimed in claim 1 wherein said third network has a star topology.

6. A magnetic resonance system as claimed in claim 1 wherein said second network does not connect said digital modules with said control computer.

7. A magnetic resonance system as claimed in claim 6 wherein one of said plurality of digital modules is a master digital module that is the only one of said digital modules that receives control commands from said control computer via said third network, and wherein said master digital module transmits said control commands to the other digital modules via said second network.

8. A magnetic resonance system as claimed in claim 1 wherein said first network comprises a synchronization module in said control computer and a plurality of synchronization units respectively in said digital modules, said synchronization module being configured to control said synchronization units via said first network.

9. A magnetic resonance system as claimed in claim 8 wherein said synchronization module is configured to generate a system clock that is transmitted to said synchronization units via said first network.

10. A magnetic resonance system as claimed in claim 9 wherein said second network comprises a time clock that is an integer multiple of said system clock.

11. A magnetic resonance system as claimed in claim 8 wherein each of said synchronization units and said synchronization module comprises a timing circuit, all of said timing circuits being synchronized and being set to a same time.

12. A magnetic resonance system as claimed in claim 1 wherein at least one of said digital modules and said at least one analog module controlled by said at least one of said digital modules are installed in an equipment unit that is external to said control computer.

13. A magnetic resonance system as claimed in claim 12 wherein said external equipment unit is selected from the group consisting of power amplifiers and signal pre-amplifiers.

14. A method for operating a magnetic resonance system having a plurality of components including at least a basic magnetic field generation unit, a gradient coil system, and a radio-frequency coil arrangement, a control computer, a plurality of digital modules and at least one analog module physically and electrically associated with one of said digital modules, said plurality of digital modules and at least one analog module being external to said control computer, said control computer, said plurality of digital modules and said at least one analog module being configured to operate said plurality of components to acquire magnetic resonance data from an examination subject, each of said digital modules having a digital module peripheral component interface, and said control computer, for each of said digital module peripheral component interfaces, having an associated control computer peripheral component interface, said method comprising the steps of:

placing said digital modules in communication with said control computer via a synchronous first network to synchronize said digital modules;

placing said digital modules in communication with each other via a second network selected from the group consisting of isosynchronous networks and semi-isosynchronous networks; and placing the respective digital module peripheral component interfaces in communication with the associated control computer peripheral component interfaces via a third network consisting of optical paths.

15. A method as claimed in claim 14 comprising exchanging data between said digital modules and said control computer by each digital module directly accessing a respective memory range of said control computer that is associated with that digital module, via said digital module peripheral component interface and said control computer peripheral module interface.

16. A method as claimed in claim 14 comprising designating one of said digital modules as a master digital module, and transmitting control commands from said control computer via said third network to only said master digital module, and transmitting corresponding control commands from said master digital module to the other digital modules in said plurality of digital modules via said second network.

17. A method as claimed in claim 14 comprising generating a system clock in a synchronization module of said control computer, and transmitting said system clock to said digital modules via said first network.

18. A method as claimed in claim 17 comprising transmitting a time stamp, that marks a reference point in time, via at least one of said first, second or third networks.

19. A method as claimed in claim 14 wherein said digital modules each comprise a synchronization unit and wherein said control computer comprises a synchronization module, and wherein each of said synchronization units and said synchronization module comprises a timing circuit, and wherein said method comprises synchronizing all of said timing circuits and setting all of said timing circuits to a same time.

20. A method as claimed in claim 19 comprising synchronizing said timing circuits via said first network, and setting said timing units to said same time via one of said second network or said third network.

* * * * *